United States Patent
Toshimitsu et al.

(10) Patent No.: US 6,861,202 B2
(45) Date of Patent: Mar. 1, 2005

(54) METHOD FOR TREATING PHOTOSENSITIVE LITHOGRAPHIC PRINTING PLATE

(75) Inventors: Eriko Toshimitsu, Kanagawa (JP); Hideaki Okamoto, Kanagawa (JP)

(73) Assignee: Lastra S.p.A., Manerbio (IT)

( * ) Notice: Subject to any disclaimer, the term of this patent is extended or adjusted under 35 U.S.C. 154(b) by 0 days.

(21) Appl. No.: 10/378,915

(22) Filed: Mar. 5, 2003

(65) Prior Publication Data

US 2003/0194654 A1 Oct. 16, 2003

Related U.S. Application Data

(62) Division of application No. 09/625,362, filed on Jul. 25, 2000, now Pat. No. 6,558,875.

(30) Foreign Application Priority Data

Jul. 27, 1999 (JP) .......................................... 11-211956

(51) Int. Cl.[7] .............................. G03F 7/26; G03F 7/40
(52) U.S. Cl. ................. 430/302; 430/271.1; 430/286.1; 430/309; 430/401; 430/432; 430/435; 430/945
(58) Field of Search ................................ 430/434, 435, 430/270.1, 271.1, 273.1, 281.1, 286.1, 287.1, 302, 309, 348, 401, 432, 944, 945, 964

(56) References Cited

U.S. PATENT DOCUMENTS

| | | | | |
|---|---|---|---|---|
| 4,326,018 A | * | 4/1982 | Jargiello | 430/15 |
| 4,396,284 A | * | 8/1983 | Fromson et al. | 355/100 |
| 4,806,506 A | | 2/1989 | Gibson, Jr. | 430/309 |
| 4,894,315 A | * | 1/1990 | Feinberg et al. | 430/281.1 |
| 5,085,976 A | | 2/1992 | Gibson, Jr. et al. | 430/306 |
| 5,688,633 A | | 11/1997 | Leach | 430/284.1 |
| 5,773,194 A | * | 6/1998 | Hattori et al. | 430/284.1 |
| 5,800,965 A | | 9/1998 | Tsuji et al. | 430/287.1 |
| 5,807,659 A | | 9/1998 | Nishimiya et al. | 430/302 |
| 6,030,712 A | | 2/2000 | Notsu et al. | 428/480 |
| 6,077,646 A | | 6/2000 | Verschueren et al. | 430/272.1 |
| 6,242,156 B1 | | 6/2001 | Teng | 430/270.1 |
| 2001/0046638 A1 | | 11/2001 | Yanaka et al. | 430/138 |
| 2002/0018962 A1 | | 2/2002 | Urano et al. | 430/273.1 |
| 2002/0106583 A1 | | 8/2002 | Kawamura et al. | 430/271.1 |

FOREIGN PATENT DOCUMENTS

| | | |
|---|---|---|
| JP | 54-18305 | 10/1979 |
| JP | 05-72735 | 3/1993 |
| JP | 5-100438 | 4/1993 |
| JP | 6-148885 | 5/1994 |
| JP | 60-273923 | 9/1994 |
| JP | 6-289611 | 10/1994 |
| JP | 09-236911 | 9/1997 |
| JP | 09-244233 | 9/1997 |
| JP | 10-10719 | 1/1998 |
| JP | 10-48839 | 2/1998 |
| JP | 2000-0066416 | 3/2000 |
| WO | WO 93/06529 | 4/1993 |

* cited by examiner

*Primary Examiner*—Barbara L. Gilliam
(74) *Attorney, Agent, or Firm*—Oblon, Spivak, McClelland, Maier & Neustadt, P.C.

(57) ABSTRACT

A method for treating a photosensitive lithographic printing plate, which comprises exposing the photosensitive lithographic printing plate to laser light, developing with a developer containing an alkali metal silicate and then carrying out post-exposure treatment, said photosensitive lithographic printing plate being prepared by forming a photopolymerizable photosensitive layer having a film thickness of from 1.2 to 4 $g/m^2$ and further forming a protective layer having a film thickness of from 2 to 8 $g/m^2$ on a support having a centerline average height (Ra) of at least 0.35 μm.

13 Claims, No Drawings

METHOD FOR TREATING PHOTOSENSITIVE LITHOGRAPHIC PRINTING PLATE

This application is a Division of application Ser. No. 09/625,362 Filed on Jul. 25, 2000, now U.S. Pat. No. 6,558,875.

TECHNICAL FIELD

The present invention relates to a method for treating a photosensitive lithographic printing plate for exposure by laser. As used herein, mass amount per unit area, when described in connection with a coating, is described in terms of "thickness".

PRIOR ARTS

In recent years, a printing plate making system (CTP system) which comprises outputting digital data inputted into a computer and edited, directly on a photosensitive lithographic printing plate by laser scanning lines, has been developed to be practically usable. By this step, a large rationalization of a printing plate making step has become possible. As a photosensitive lithographic printing plate used for this system, a photopolymer type photosensitive lithographic printing plate using a photopolymerizable photosensitive material is useful from viewpoints of easy handling, a problem of a waste water, and the like. However, since a photopolymer type photosensitive material is poor in adhesiveness with a support, there has been a problem that a printing resistance becomes extremely poor depending on plate making and printing conditions. In order avoid these problems, a heat-treating step at about 100° C. is often carried out after subjecting a photosensitive lithographic printing plate to laser exposure as one step of printing plate making process. However, since this heat-treating step requires to maintain an apparatus at a high temperature, it is difficult to carry out unmanned operation even during night time and the apparatus must accompanied by an operator even after treatment until it is cooled to a certain level. This makes an obstacle to the above-mentioned rationalization which is one of objects of CTP system. On the other hand, it is known to carry out post-exposure after exposing a photopolymer type photosensitive lithographic printing plate to laser light and developing.

For example, JP-A-6-148885 and JP-A-6-289611 provide a photopolymerizable composition having a satisfactory developing property and a high resolving power by containing a specific photopolymerization initiator, and their examples illustrate steps of exposing a photopolymerizable photosensitive lithographic printing plate to laser light, developing with a sodium carbonate aqueous solution and then carrying out post-exposure by a metal halide lamp. More concretely, it is disclosed (1) to prepare a photosensitive lithographic printing plate by forming an overcoat layer of a dry thickness of 1.5 g/m² for shielding an enzyme after forming a photopolymerizable photosensitive layer of a dry weight of 3.5 g/m² on an aluminum plate of 0.6 μm having a surface roughness of Ra after surface-roughening treatment, (2) to describe a pattern on said photosensitive lithographic printing plate by scanning exposure with an argon ion laser of 1 mJ/cm², and then (3) to carry out post-exposure with a metal halide lamp of 1 J/cm² to complete a printing plate.

However, according to the analysis by the present inventors, it has been found that even in the case of carrying out post-exposure, depending on a kind of photosensitive lithographic printing plate and a kind of a developer, a printing resistance and a developing property (stain property) before and after storing are unsatisfactory. Thus, the present invention provides a method for treating a photosensitive lithographic printing plate to provide a photopolymer type photosensitive lithographic printing plate having a stable printing resistance and excellent in other printing performances before and after storing.

On the other hand, an effect of improving an image strength achieved by carrying out post-exposure after development can be expected to some extent since a total light exposure amount imparted to a formed image becomes large. Heretofore, a total light exposure amount was seriously considered, but a light intensity (light exposure amount per unit time) on a surface to be exposed was not seriously considered. Also, in view of a general relation between a light intensity of a post-exposure light source and a distance from the light source to a surface to be exposed, the light intensity on the surface to be exposed was considered to be relatively low, usually at most about 15 mW/cm², and such an image strength as to satisfy a commercial demand could not be achieved even by post-exposure treatment.

Thus, an object of the present invention is to provide a method for treating a photosensitive lithographic printing plate, which gives a satisfactory image strength to an image obtained by laser light scanning exposure and development and reduces a required light exposure amount at the time of laser light exposure.

DISCLOSURE OF THE INVENTION

The present inventors have conducted an extensive study and have found that the above problems can be solved by exposing a photosensitive lithographic printing plate having specific conditions to laser light, developing with a specific developer and then carrying out post-exposure treatment.

That is, the first essential feature of the present invention resides in a method for treating a photosensitive lithographic printing plate, which comprises exposing the photosensitive lithographic printing plate to laser light, developing with a developer containing an alkali metal silicate and then carrying out post-exposure treatment, said photosensitive lithographic printing plate being prepared by forming a photopolymerizable photosensitive layer having a film thickness of from 1.2 to 4 g/m² and further forming a protective layer having a film thickness of from 2 to 8 g/m² on a support having a centerline average height (Ra) of at least 0.35 μm.

Further, the present inventors have conducted an extensive study to solve the above problems, and have found that the above objects can be achieved by defining a light intensity on an image-forming surface in a specific range at the time of carrying out the post-exposure treatment. That is, the second essential feature of the present invention resides in a method for treating a photosensitive lithographic printing plate, which comprises exposing the photosensitive lithographic printing plate to laser light, developing and then carrying out post-exposure treatment at a light intensity of from 20 to 500 mW/cm² on a surface to be exposed at the time of the post-exposure treatment, said photosensitive lithographic printing plate being prepared by forming a photosensitive layer comprising a photopolymerizable composition containing an ethylenic compound, a photopolymerization initiator and a high molecular binder on the surface of a support.

Preferably, the post-exposure treatment of each of the above methods is carried out by a mercury lamp.

DETAILED DESCRIPTION OF THE PRESENT INVENTION

Hereinafter, the present invention is described in details.

A photosensitive lithographic printing plate used in the method of the present invention is prepared by forming a photopolymerizable photosensitive layer and a protective layer as an oxygen-shielding layer in order on a support having a hydrophilic surface.

Examples of the support include metal, plastic, paper and the like, and an aluminum support is particularly preferably used. When an aluminum plate is used as the support, it is subjected to surface treatments including roughening treatment (sand blasting), anodization and optionally sealing treatment. These treatments can be carried out by well known methods.

Examples of the roughening treatment include a mechanical method, an etching method by electrolysis and the like. Examples of the mechanical method include ball abrading method, brush-abrading method, hydro-honing abrading method, buff abrading method and the like. The hydrolysis etching is generally carried out in an acidic hydrolyte. The hydrolyte comprises preferably hydrochloric acid or nitric acid as the main component, and an acid concentration is usually from 0.5 to 5 wt %. Also, the hydrolyte may optionally contain further a chloride, amines, aldehydes, phosphoric acid, chromic acid, boric acid, acetic acid, oxalic acid and the like, if necessary.

Conditions of the electrolytic etching are selected depending on a kind of an electrolyte used, but a voltage applied is usually from 1 to 50 V, preferably from 5 to 40 V, and an electric current density is from 10 to 200 A/dm$^2$, preferably from 20 to 150 A/dm$^2$. The electric current used may be either direct current or alternating current, but alternating current is preferable. The frequency of the alternating current is from 1 to 400 Hz, preferably from 2 to 100 Hz, and the electrolyte temperature is from 10 to 50° C., preferably from 15 to 40° C.

Depending on a composition or other conditions of an aluminum material used, the above-mentioned various surface roughening methods can be used respectively alone or in combination, but a roughness produced by this roughening treatment is required to be a centerline average height (Ra) of at least 0.35 $\mu$m in terms of JIS standard. If Ra is smaller than the above value, a satisfactory printing resistance can hardly be obtained. The upper limit of Ra is usually at most 1.0 $\mu$m. In the case of electrolytic etching, it is possible to maintain a Ra value within the above-mentioned range by optionally controlling temperature, time, voltage, electric current density, a kind of electrolyte, concentration or the like. The electrolytically roughened aluminum support may optionally be subjected to desmut treatment, if necessary. The desmut treatment is carried out by using an acid or alkali aqueous solution. Examples of the acid include sulfuric acid, nitric acid, hydrochloric acid, phosphoric acid, chromic acid and the like, and examples of the alkali include sodium hydroxide, potassium hydroxide, potassium tertiary phosphate, sodium aluminate, sodium metasilicate, and the like. Among them, it is preferable to use alkali. Examples of treatment system include a method of dipping in the above acid or alkali aqueous solution, a spraying method and the like. When the desmut treatment is carried out by using an alkali aqueous solution, it is preferable to carry out neutralization treatment with an acid such as sulfuric acid, nitric acid, hydrochloric acid, phosphoric acid, chromic acid or the like or a mixed acid thereof since an etching treating agent or impurities including dissolved smut remain on the aluminum surface. This treatment system may be any type of system such as dipping or spraying.

Anodization treatment is carried out by electrolysis using an aluminum plate as an anode and using one or two or more solutions of sulfuric acid, chromic acid, oxalic acid, phosphoric acid, malonic acid or the like as an electrolyte. Conditions of the anodization treatment vary depending on a kind of an electrolyte used, but an aqueous solution comprising from 1 to 50 wt %, preferably from 15 to 30 wt %, of sulfuric acid and/or phosphoric acid is used as an electrolyte under conditions of an electrolyte temperature of from 5 to 70° C., preferably from 15 to 35° C., an electric current density of from 1 to 20 A/dm$^2$, an electric voltage of from 1 to 100 V and an electrolysis time of from 1 second to 5 minutes. Further, as described in U.S. Pat. No. 1,412,768, a method of electrolyzing in sulfuric acid at a high electric current density may be used. Among them, a method of using an electrolyte containing sulfuric acid is particularly preferable in respect that a printing plate is hardly stained at the time of printing and a width (damping water width) of an amount of damping water applied onto a printing plate at the time of printing is large. Also, an amount of an anodized film formed is suitably from 1 to 50 mg/dm$^2$, preferably from 10 to 40 mg/dm$^2$.

After anodizing treatment, sealing treatment may be carried out, if necessary. Examples of the sealing treatment include treatment with boiling water, treatment with water vapor, treatment with sodium silicate, treatment with bichromate aqueous solution, and the like. Also, an aluminum support may optionally be subjected to undercoating treatment with a water soluble high molecular compound such as cellulose, starch, polyvinyl phosphonic acid or a resin having a cationic quaternary ammonium group, or an aqueous solution of a metal salt of fluorozirconic acid.

The photopolymerizable photosensitive layer of the photosensitive lithographic printing plate of the present invention is usually formed by coating a photopolymerizable composition containing a high molecular binder, an addition-polymerizable compound having at least one ethylenic unsaturated double bond and a photopolymerization initiator on the above treated support and drying.

The addition-polymerizable compound having at least one ethylenic unsaturated double bond (hereinafter referred to as "ethylenic compound") used in the present invention means a compound having an ethylenic double bond-addition-polymerizable by the action of a photopolymerization initiator and curable when the photopolymerizable composition is irradiated with an active light, for example, a monomer having an ethylenic unsaturated double bond. The term "monomer" used in the present invention means a material opposed to a high molecular material, and includes a dimer, a trimer and an oligomer, in addition to a monomer.

In the present invention, an ethylenic compound may be a compound having one ethylenic unsaturated bond in a molecule, such as an unsaturated carboxylic acid including (meth)acrylic acid (the term "(meth)acryl" used in the present invention means "acryl" and "methacryl"), crotonic acid, isocrotonic acid, maleic acid, itaconic acid, citraconic acid or the like, and their alkyl esters, (meth)acrylonitrile, (meth)acrylamide, styrene and the like, but a compound having at least two ethylenic unsaturated bonds in a molecule is preferable.

Examples of such an ethylenic compound include an unsaturated carboxylic acid; an ester of an aliphatic polyhydroxy compound and an unsaturated carboxylic acid; an ester of an aromatic polyhydroxy compound and an unsaturated carboxylic acid; an ester obtained by esterification of an unsaturated carboxylic acid and a polyhydroxy compound such as a polyhydric carboxylic acid, an aliphatic polyhydroxy compound, an aromatic polyhydroxy compound or the like, urethane(meth)acrylates obtained by reaction of a polyisocyanate compound and a hydroxy(meth)acrylate compound, epoxy(meth)acrylates obtained by reaction of a polyepoxy compound and a (meth)acrylic acid or hydroxy(meth)acrylate compound, and a (meth)acryloyl group-containing phosphoric acid ester compound, and the like.

Examples of said ester of an aliphatic polyhydroxy compound and an unsaturated carboxylic acid include reaction products of said unsaturated carboxylic acid and said aliphatic polyhydroxy compound such as ethylene glycol, diethylene glycol, triethylene glycol, tetraethylene glycol, propylene glycol, tripropylene glycol, trimethylene glycol, tetramethylene glycol, neopentyl glycol, hexamethylene glycol, nonamethylene glycol, trimethylolethane, tetramethylolethane, trimethylolpropane, glycerol, pentaerythritol, dipentaerythritol, sorbitol, and their ethylene oxide adducts, propylene oxide adducts, diethanolamine, triethanolamine or the like, for example, ethylene glycol di(meth)acrylate, diethylene glycol di(meth)acrylate, triethylene glycol di(meth)acrylate, tetraethylene glycol di(meth)acrylate, propylene glycol di(meth)acrylate, tripropylene glycol di(meth)acrylate, tetramethylene glycol di(meth)acrylate, neopentyl glycol di(meth)acrylate, hexamethylene glycol di(meth)acrylate, nonamethylene glycol di(meth)acrylate, trimethylolethane tri(meth)acrylate, tetramethylolmethane tri(meth)acrylate, trimethylolpropane di(meth)acrylate, trimethylolpropane tri(meth)acrylate, trimethylolpropane ethylene oxide adduct tri(meth)acrylate, glycerol di(meth)acrylate, glycerol tri(meth)acrylate, glycerol propylene oxide adduct tri(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol tetra(meth)acrylate, dipentaerythritol penta(meth)acrylate, dipentaerythritol hexa(meth)acrylate, sorbitol tri(meth)acrylate, sorbitol tetra(meth)acrylate, sorbitol penta(meth)acrylate, sorbitol hexa(meth)acrylate or the like, and their corresponding crotonate, isocrotonate, maleate, itaconate, citraconate, and the like.

Examples of an ester of an unsaturated carboxylic acid and an aromatic polyhydroxy compound such as hydroquinone, resorcin, pyrogallol or the like, include hydroquinone diacrylate, hydroquinone dimethacrylate, resorcin diacrylate, resorcin dimethacrylate, pyrogallol triacrylate, and the like.

An ester obtained by esterification of an unsaturated carboxylic acid with a polyhydric carboxylic acid and a polyhydric hydroxy compound is not always a single material, but their typical examples include a condensate of acrylic acid, phthalic acid and ethylene glycol; a condensate of acrylic acid, maleic acid and diethylene glycol; a condensate of methacrylic acid, terephthalic acid and pentaerythritol; a condensate of acrylic acid, adipic acid, butanediol and glycerin; and the like.

Other examples of an ethylenic compound include urethane acrylates such as an adduct of tolylene diisocyanate and hydroxyethyl acrylate; epoxy acrylates such as an adduct of diepoxy compound and hydroxyethyl acrylate; acrylamides such as ethylene bisacrylamide or the like; acrylic acid esters such as diacryl phthalate or the like; a vinyl group-containing compound such as divinyl phthalate; and the like.

Examples of said urethane (meth)acrylates include an aliphatic polyisocyanate such as hexamethylene diisocyanate, 2,4,4-trimethylhexamethylene diisocyanate, lysine methyl ester diisocyanate, lysine methyl ester triisocyanate, dimer acid diisocyanate, 1,6,11-undecatriisocyanate, 1,3,6-hexamethylene triisocyanate, 1,8-diisocyanate-4-isocyanate methyloctane or the like, an alicyclic polyisocyanate such as cyclohexane diisocyanate, dimethylcyclohexane diisocyanate, 4,4'-methylenebis (cyclohexyl isocyanate), isophorone diisocyanate, bicycloheptane triisocyanate or the like, an aromatic polyisocyanate such as p-phenylene diisocyanate, 2,4-tolylene diisocyanate, 2,6-tolylene diisocyanate, xylylene diisocyanate, tetramethylxylylene diisocyanate, 4,4'-diphenylmethane diisocyanate, tolidine diisocyanate, 1,5-naphthalene diisocyanate, tris (isocyanatephenylmethane), tris(isocyanatephenyl) thiophosphate or the like, reaction products of a polyisocyanate compound such as a heterocyclic polyisocyanate including isocyanurate and a hydroxy(meth)acrylate compound such as hydroxymethyl(meth)acrylate, hydroxyethyl (meth)acrylate, glycerol di(meth)acrylate, pentaerythritol tri (meth)acrylate or tetramethylolethane tri(meth)acrylate, and the like.

Also, examples of said epoxy(meth)acrylates include an aliphatic polyepoxy compound such as (poly)ethylene glycol polyglycidyl ether, (poly)propylene glycol polyglycidyl ether, (poly)tetramethylene glycol polyglycidyl ether, (poly) pentamethylene glycol polyglycidyl ether, (poly)neopentyl glycol polyglycidyl ether, (poly)hexamethylene glycol polyglycidyl ether, (poly)trimethylolpropane polyglycidyl ether, (poly)glycerol polyglycidyl ether, (poly)sorbitol polyglycidyl ether or the like, a heterocyclic polyoxy compound such as sorbitan polyglycidyl ether, triglycidyl isocyanurate, triglycidyl tris(2-hydroxyethyl)isocyanurate or the like, and a reaction product of (meth)acrylic acid or hydroxy(meth)acrylate compound with a polyepoxy compound of an aromatic polyepoxy compound such as phenol novolak polyepoxy compound, bromated phenol novolak polyepoxy compound, (o-, m-, p-)cresol novolak polyepoxy compound, bisphenol A polyepoxy compound, bisphenol F polyepoxy compound or the like.

Among the above listed ethylenic compounds, it is particularly preferable to include a monomer of acrylate or methacrylate.

Further, preferable examples of an ethylenic compound include a phosphoric acid ester compound having at least one (meth)acryloyl group, and the aimed effect of the present invention can be satisfactorily achieved by using a photopolymerizable photosensitive composition containing said phosphoric ester compound in combination with an aluminum support anodized with an electrolyte containing sulfuric acid.

Said phosphoric acid ester compound containing at least one (meth)acryloyl group is not specially limited so long as it is a phosphoric acid ester having at least one (meth) acryloyl group in its structure, and their examples are expressed by the following formula (I).

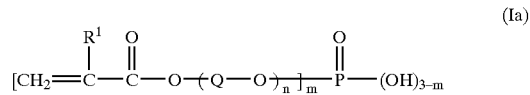

(Ia)

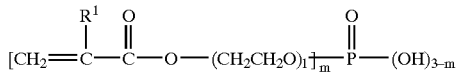

(Ib)

(In the above formulae (Ia) and (Ib), $R^1$ is a hydrogen atom or a methyl group, Q is a $C_{1-25}$ divalent alkylene chain, l is an integer of from 1 to 25, n is an integer of from 1 to 2, and m is 1, 2 or 3.)

In the formula (I), n is preferably 1, and Q has preferably a carbon number of from 1 to 10, particularly 1 to 4. Their examples include (meth)acryloyloxyethyl phosphate, bis [(meth)acryloyloxyethyl]phosphate, (meth) acryloyloxyethylene glycol phosphate, and the like, and they may be used respectively alone or in a mixture. When said phosphoric acid ester compound is used, it may preferably be contained in an amount of from 1 to 50 wt %, particularly from 5 to 50 wt %, of the total ethylenic compounds. If it is contained in the above range, there is tendency that non-image parts are hardly stained.

Hereinafter, a photopolymerization initiator is explained. Any photopolymerization initiator can be used if it initiates the polymerization of said ethylenic compound. A photopolymerization initiator generally contains a radical-generating agent, a sensitizer and optionally a polymerization accelerator. The radical-generating agent generates an active radical when a photopolymerizable composition is irradiated with active light, and initiates the polymerization of said ethylenic compound. Any radical-generating agent can be satisfactorily used if it has a photosensitivity to from ultraviolet light to visible light and further to infrared light. Among them, examples of a radical-generating agent causing an action with a photo-excited sensitizer include hexaarylbiimidazoles, a titanocene compound, a halogenated hydrocarbon derivative, a diaryliodonium salt, an organic peroxide, and the like. Among them, a system employing hexaarylbiimidazoles or a titanocene compound is preferable in respect of sensitivity, shelf life, and adhesiveness of a coating film to a substrate.

Various kinds of hexaarylbiimidazoles can be used, examples of which include 2,2'-bis(o-chlorophenyl)-4,4',5, 5'-tetra(p-fluorophenyl)biimidazole, 2,2'-bis(o-bromophenyl)-4,4',5,5'-tetra(p-iodophenyl)biimidazole, 2,2'-bis(o-chlorophenyl)-4,4',5,5'-tetra(p-chloronaphthyl) biimidazole, 2,2'-bis(o-chlorophenyl)-4,4',5,5'-tetra(p-chlorophenyl)biimidazole, 2,2'-bis(o-bromophenyl)-4,4',5, 5'-tetra(p-chloro-p-ethoxyphenyl)biimidazole, 2,2'-bis(o-chlorophenyl)-4,4',5,5'-tetra(o,p-dichlorophenyl) biimidazole, 2,2'-bis(o-chlorophenyl)-4,4',5,5'-tetra(o,p-dibromophenyl)biimidazole, 2,2'-bis(o-bromophenyl)-4,4', 5,5'-tetra(o,p-dichlorophenyl)biimidazole, 2,2'-bis(o,p-dichlorophenyl)-4,4',5,5'-tetra(o,p-dichlorophenyl) biimidazole, 2,2'-bis(o-chlorophenyl)-4,4',5,5'-tetra(p-chloronaphthyl)biimidazole, and the like. These imidazoles may be used optionally in combination with other kinds of biimidazoles. Biimidazoles can be easily prepared, for example, by a method disclosed in Bull. Chem. Soc. Japan, 33,565(1960) and J. Org. Chem. 36[16]2262(1971).

Various kinds of titanocene compounds can be used, but may be optionally selected from various titanocene compounds disclosed in JP-A-59-152396 and JP-A-61-151197. Examples of the titanocene compounds include dicyclopentadienyl-Ti-dichloride, dicyclopentadienyl-Ti-bisphenyl, dicyclopentadienyl-Ti-bis-2,3,4,5,6-pentafluorophenyl, dicyclopentadienyl-Ti-bis-2,3,5,6-tetrafluorophenyl, dicyclopentadienyl-Ti-bis-2,4,6-trifluorophenyl, dicyclopentadienyl-Ti-bis-2,6-difluorophenyl, dicyclopentadienyl-Ti-bis-2,4-difluorophenyl, dimethylcyclopentadienyl-Ti-bis-2,3,4,5,6-tetrafluorophenyl, dimethylcyclopentadienyl-Ti-bis-2,6-difluorophenyl, dicyclopentadienyl-Ti-bis-2,6-difluoro-3-(1-pyrrolyl)phenyl, and the like.

Hereinafter, a sensitizer in the photopolymerization initiator is explained. The sensitizer in the present invention means a compound effectively generating an active radical in the presence of said radical-generating agent by activating the radical-generating agent by irradiation with ultraviolet light, visible light or infrared light.

Typical examples of the sensitizer effectively generating an active radical by irradiation with visible light include a photo-reducible dye such as erythron or eosine Y, a triphenylmethane type leuco dye such as leuco crystal violet or leuco-malachite green as disclosed in U.S. Pat. No. 3,479, 185, aminophenylketones such as Michler's ketone or aminostyryl ketone as disclosed in U.S. Pat. No. 3,549,367 and U.S. Pat. No. 3,652,275, β-diketones as disclosed in U.S. Pat. No. 3,844,790, indanones as disclosed in U.S. Pat. No. 4,162,162, cumalin type dyes as disclosed in JP-A-6-301208, JP-A-8-129258, JP-A-8-129259, JP-A-8-146605 and JP-A-8-211605, ketocumalins as disclosed in JP-A-52-112681, aminostyrene derivatives or aminophenylbutadiene derivatives as disclosed in JP-A-59-56403, aminophenyl heterocyclic compounds as disclosed in U.S. Pat. No. 4,594, 310, durolidine heterocyclic compounds as disclosed in U.S. Pat. No. 4,966,830, pyrromethene type dyes as disclosed in JP-A-5-241338, JP-A-7-5685 and JP-A-10-144242, and the like. Among them, when exposed to a laser light of 450 to 600 nm, cumalin type or pyrromethine type dyes are preferable, and when exposed to a laser light of 390 to 430 nm, dialkylaminobenzene type compounds are preferable, in respect of sensitivity.

Further, a photopolymerization-initiating performance can be raised optionally by adding a polymerization accelerator to a photopolymerization initiator, and examples of the polymerization accelerator include a mercapto group-containing compound such as 2-mercaptobenzothiazole, 2-mercaptobenzimidazole, 2-mercaptobenzoxazole, 3-mercapt-1,2,4-triazole or the like, a N-aryl-α-amino acid or its derivatives such as N-phenylglycine, N,N-dialkylbenzoic acid alkyl ester, N,N-dialkylaminobenzoic acid ester, N-phenylglycine, or its ammonium or sodium salt, or its ester derivatives, N-phenylalanine, or its ammonium or sodium salt, or its ester derivatives, and a hydrogen-donating compound such as a compound expressed by the following formula (II).

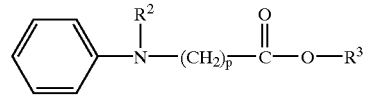

(II)

[In the formula (II), $R^2$ is a hydrogen atom or an alkyl group which may have a substituent, $R^3$ is a hydrogen, an alkyl group which may have a substituent, a vinyl group which may have a substituent, an allyl group which may have a substituent, a (meth)acryloyloxy group which may have a substituent, an aryl group which may have a substituent or an aromatic heterocyclic group which may have a substituent, and the benzene ring may have a substituent, and p is an integer of from 2 to 10.]

Examples of a substituent on the benzene ring include an alkyl group which may have a substituent, an alkoxy group which may have a substituent, an acyl group which may have a substituent, an alkoxycarbonyl group which may have a substituent, a vinyl group which may have a substituent, an allyl group which may have a substituent, a (meth)acryloyloxy group which may have a substituent, an aryl group which may have a substituent or an aromatic heterocyclic group which may have a substituent. Among them, particularly preferable examples include a compound having a mercapto group such as 2-mercaptobenzothiazole, 2-mercaptobenzimidazole, 2-mercaptobenzoxazole, 3-mercapto-1,2,4-triazole and the like.

Hereinafter, a high molecular binder is explained.

The high molecular binder is a component imparting a film-forming performance or a viscosity-controlling performance, examples of which include an alkali-soluble high molecular binder, and among them a high molecular binder having a carboxyl group in a molecule is preferable in respect of alkali-developing property.

Examples of the high molecular binder having a carboxyl group in a molecule include a homopolymer or copolymer of (meth)actylic acid, (meth)acrylic acid ester, (meth) acrylamide, maleic acid, (meth)acrylonitrile, styrene, vinyl acetate, vinylidene chloride, maleimide or the like, and polyethylene oxide, polyvinyl pyrrolidone, polyamide, polyurethane, polyester, polyether, polyethylene terephthalate, acetylcellulose, polyvinylbutyral, and the like. Among them, a preferable example includes a copolymer containing at least one kind of (meth)acrylic acid ester and (meth)acrylic acid as copolymerizable components. The high molecular binder having a carboxyl group in a molecule preferably has an acid value of from 10 to 250 and a weight average molecular weight (hereinafter referred to as "Mw") of from 5,000 to 500,000.

These high molecular binders preferably have an unsaturated bond on a side chain, particularly at least one unsaturated bond expressed by the following formula (II)

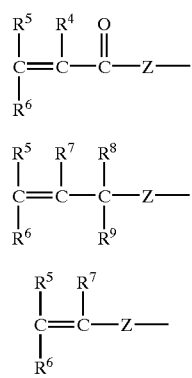

(In the above formulae, $R^4$ is a hydrogen atom or a methyl group, and each of $R^5$ to $R^8$ is independently a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent or an arylsulfonyl group which may have a substituent, and Z is an oxygen atom, a sulfur atom, an imino group or an alkylimino group.)

Examples of a substituent which may be bonded to the above alkyl group are not specially limited so long as it does not remarkably lower the reactivity of a carbon-carbon double bond, but are usually selected from a halogen atom, an alkyl group, a phenyl group, a cyano group, a nitro group, an alkoxy group, an alkylthio group, a dialkylamino group, and the like.

Among them, $R^4$ is preferably a hydrogen atom or a methyl group, and each of $R^5$ and $R^6$ is preferably independently a hydrogen atom, a lower alkyl group, an alkoxy group, a dialkylamino group or a cyano group.

Examples of a high molecular binder having an unsaturated bond on a side chain and containing a carboxyl group in a molecule include a compound obtained by reacting a part of carboxyl groups of a high molecular binder having a carboxyl group in a molecule with an epoxy group-containing unsaturated compound as disclosed in JP-A-9-346144.

Examples of the epoxy group-containing unsaturated compound include an aliphatic epoxy group-containing unsaturated compound such as glycidyl(meth)acrylate, allylglycidyl ether, α-ethylglycidyl acrylate, crotonylglycidyl ether, glycidyl crotonate, glycidyl isocrotonate, itaconic acid monoalkyl ester monoglycidyl ester, fumaric acid monoalkyl ester monoglycidyl ester, maleic acid monoalkyl ester monoglycidyl ester or the like, and cycloaliphatic epoxy group-containing unsaturated compounds expressed by the following structures.

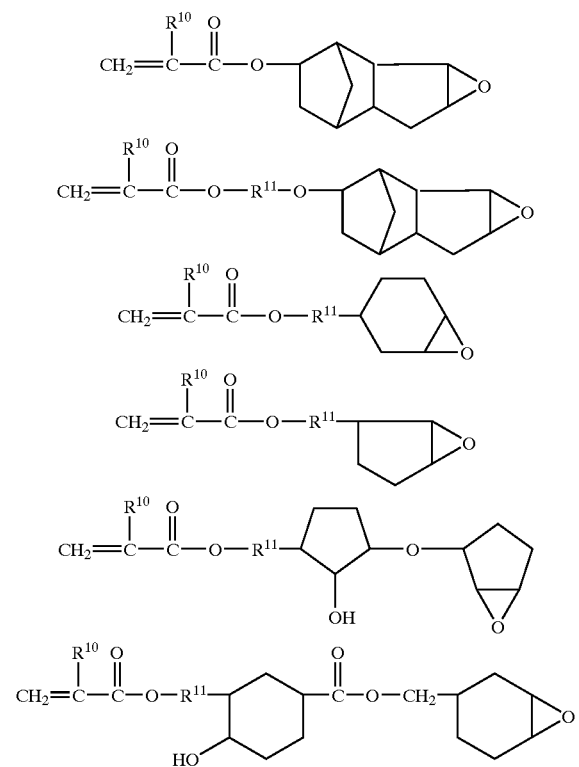

(In the above formulae, $R^{10}$ is a hydrogen atom or a methyl group, and $R^{11}$ is a $C_{1-6}$ divalent aliphatic saturated hydrocarbon group.)

A high molecular binder having an ethylenic unsaturated bond on a side chain as expressed by the above formula (IIIa) is obtained by reacting a carboxyl group-containing polymer with a cycloaliphatic epoxy group-containing unsaturated compound or the like at a temperature of from 80 to 120° C. for 1 to 50 hours in such a manner as to react from 5 to 90 mol %, preferably from 30 to 70 mol % of the carboxyl group contained in the carboxyl group-containing polymer.

Also, a high molecular binder having an ethylenic unsaturated bond on a side chain as expressed by the formula (IIIb) can be obtained by copolymerizing a compound having at least two unsaturated groups such as allyl(meth)acrylate, 3-allyloxy-2-hydroxypropyl(meth)acrylate, cinnamyl(meth)acrylate, crotonyl(meth)acrylate, methallyl (meth)acrylate, N,N-diallyl(meth)acrylamide or the like with an unsaturated carboxylic acid such as (meth)acrylic acid or unsaturated carboxylic acid ester in such a manner as to make the content of the former compound having at least two unsaturated groups from 10 to 90 mol %, preferably from 30 to 80 mol %, in the total copolymer, and a high molecular binder having an ethylenic unsaturated bond as expressed by the above formula (IIIc) can be obtained by copolymerizing a compound having at least two unsaturated groups such as vinyl(meth)acrylate, 1-chlorovinyl(meth)acrylate, 2-phenylvinyl(meth)acrylate, 1-propenyl(meth)acrylate, vinyl crotonate, vinyl(meth)acrylamide or the like with an unsaturated carboxylic acid such as (meth)acrylic acid or unsaturated carboxylic acid ester in such a manner as to make the content of the former compound having at least two unsaturated groups from 10 to 90 mol %, preferably from 30 to 80 mol %, in the total copolymer.

Hereinbefore, main components of a photopolymerizable composition for forming a photosensitive layer are explained in details. A photopolymerization initiator used preferably contains a sensitizer preferably in an amount of from 0.01 to 20 parts by weight, more preferably from 0.05 to 10 parts by weight, an activator preferably in an amount of from 0.1 to 80 parts by weight, more preferably from 0.5 to 50 parts by weight, and a polymerization accelerator preferably in an amount of from 0.1 to 80 parts by weight, more preferably from 0.05 to 60 parts by weight, to 100 parts by weight of an ethylenic compound, and a high molecular binder is used preferably in an amount of from 10 to 400 parts by weight, more preferably from 20 to 200 parts by weight.

Also, in addition to the above component, the photopolymerizable composition may further contain other materials depending on its use. For example, the photopolymerizable composition may further contain a thermal polymerization inhibitor such as hydroquinone, p-methoxyphenol, 2,6-di-t-butyl-p-cresol or the like; a colorant comprising an organic or inorganic dye or pigment; a plasticizer such as dioctyl phthalate, didodecyl phthalate, tricresyl phosphate or the like, a sensitivity improver such as tertiary amine or thiol, a coating property improver such as a surfactant including a fluorine type surfactant, a development-accelerating agent, and other additives such as a dye precursor, or the like.

A preferable amount of each of the above-mentioned various additives is generally at most 2 parts by weight of a thermal polymerization inhibitor, at most 20 parts by weight of a colorant, at most 40 parts by weight of a plasticizer, at most 10 parts by weight of a coating property improver or a development accelerator, and at most 30 parts by weight of a dye precursor, to 100 parts by weight of an ethylenic compound.

The above-mentioned photopolymerizable composition is diluted with an appropriate solvent, and is coated on the above support and is dried to form a photosensitive layer.

Examples of the solvent used for coating the photopolymerizable composition solution are not specially limited, provided that it has a satisfactory solubility to components used and provides a satisfactory coating property, examples of which include a cellosolve type solvent such as methyl cellosolve, ethyl cellosolve, methyl cellosolve acetate, ethyl cellosolve acetate or the like, a propylene glycol type solvent such as propylene glycol monomethyl ether, propylene glycol monoethyl ether, propylene glycol monobutyl ether, propylene glycol monomethyl ether acetate, propylene glycol monoethyl ether acetate, propylene glycol monobutyl ether acetate, dipropylene glycol dimethyl ether or the like, an ester type solvent such as butyl acetate, amyl acetate, ethyl butyrate, butyl butyrate, diethyl oxalate, ethyl pyruvate, ethyl-2-hydroxy butyrate, ethyl acetoacetate, methyl lactate, ethyl lactate, methyl 3-methoxypropionate or the like, an alcohol type solvent such as heptanol, hexanol, diacetone alcohol, furfuryl alcohol or the like, a ketone type solvent such as cyclohexanone, methylamyl ketone or the like, a high polar solvent such as dimethylformamide, dimethylacetamide, N-methylpyrrolidone or the like, or their mixture solvents, or further mixtures mixed with an aromatic hydrocarbon. The solvent is used generally in a weight amount of from 1 to 20 times to the total amount of the photopolymerizable composition.

The composition can be coated in a well known method such as dip coating, rod coating, spinner coating, spray coating, roll coating or the like. A coating film thickness is usually from 0.1 to 10 $g/m^2$, preferably from 0.5 to 5 $g/m^2$, but in the first feature of the present invention, a dry film thickness must be from 1.2 to 4 $g/m^2$, and if the dry film thickness is thinner than this range, storage properties become poor (a sensitivity lowers and a non-image part is not satisfactorily developed at the time of development), and if the dry film thickness is thicker than this range, a sensitivity is insufficient, and the effect of the first feature of the present invention is not fully achieved. The dry film thickness is preferably from 1.2 to 3.5 $g/m^2$. The film thickness of the photosensitive layer of the first feature of the present invention is equivalent to a preferable film thickness of the photosensitive layer of the second feature of the present invention. A drying temperature is preferably from 30 to 150° C., more preferably from 40 to 110° C.

In the photosensitive lithographic printing plate of the present invention, a protective layer is provided as an oxygen-shielding layer for inhibiting polymerization by oxygen on a photopolymerizable photosensitive layer as an upper layer. The protective layer usually contains a water-soluble high molecular binder, and well known various water-soluble high molecular compounds are illustrated, examples of which include polyvinyl alcohol, polyvinyl pyrrolidone, polyethylene oxide, cellulose, a partially acetal-modified product of polyvinyl alcohol, its cation-modified product by a quaternary ammonium salt or the like, its anion-modified derivative by sodium sulfonate or the like, methyl cellulose, carboxymethyl cellulose, hydroxylethyl cellulose, hydroxypropyl cellulose, gelatin, gum arabic, methyl vinyl ether-maleic anhydride copolymer, a partially saponified product of polyacrylic acid ester, vinylpyrrolidone, a carboxyl group-containing compound such as an unsaturated carboxylic acid including (meth) acrylic acid, itaconic acid or the like and its derivatives, a copolymer comprising a hydroxy group-containing compound including hydroxyethyl(meth)acrylamide or the like as a copolymerizable component, and the like. The water-soluble high molecular compound has a weight average molecular weight of from 1,000 to 300,000, preferably from 4,000 to 100,000. Among them, polyvinyl alcohol or its derivative having a high oxygen gas barrier property is particularly preferable. Also, its saponification degree is preferably from 70 to 99 mol %, more preferably from 85 to 95 mol %.

Further, in view of adhesiveness to a photosensitive layer, it is preferable to include a vinylpyrrolidone type polymer such as polyvinyl pyrrolidone, vinylpyrrolidone-vinyl acetate copolymer or the like, an acrylic polymer emulsion, a diisocyanate compound, p-toluenesulfonic acid, hydroxyacetic acid or the like, and it is preferable to contain these materials in an amount of from 0.1 to 60 parts by weight, more preferably from 1 to 50 parts by weight, to 100 parts by weight of said polyvinyl alcohol and its derivatives.

These water-soluble high molecular compounds are used respectively alone or in a mixture, and preferably contain an organic acid such as succinic acid or an organic acid salt such as ethylenediamine tetraacetic acid in view of storage property, and in order to improve a coating property, they may further contain a nonionic surfactant such as polyoxyethylene alkylphenyl ether, an anionic surfactant such as sodium dodecylbenzene sulfonate and a cationic surfactant such as alkyltrimethylammonium chloride, and a defoaming agent, a dye, a plasticizer, a pH-adjustor or the like in an amount of at most 10 parts by weight to 100 parts by weight of said polyvinyl alcohol and its derivative. A coating process of the protective layer may be carried out by a well known method in the same manner as in the coating of a photosensitive layer. A coating film thickness is usually from 1 to 10 g/m$^2$, preferably from 1.5 to 7 g/m$^2$, but in the first feature of the present invention, a dry film thickness must be from 2 to 7 g/m$^2$. If the dry film thickness is thinner than this range, a sensitivity is insufficient, and on the other hand, if the dry film thickness is thicker than this range, a storage property becomes poor, and consequently a sensitivity is lowered and a non-image part is not satisfactorily developed. Thus, the effect of the present invention is not fully achieved. A drying temperature is usually from 30 to 110° C., preferably from 40 to 70° C. The protective layer film thickness of the first feature of the present invention is equivalent to a preferable protective film thickness of the second feature of the present invention.

The method for treating a photosensitive lithographic printing plate in accordance with the present invention comprises exposing the photosensitive lithographic printing plate to laser light, developing, and then carrying out postexposure.

Examples of the laser exposure light source includes well known laser light sources such as helium cadmium laser, argon ion laser, FD-YAG laser, helium neon laser, semiconductor layer, YAG laser, ruby laser or the like, and more particular preferable examples include a semiconductor laser of blue-violet zone of from 390 to 430 nm, an argon ion laser of in the vicinity of 488 nm wavelength, a FD-YAG laser of in the vicinity of 532 nm wavelength, a YAG laser or a semiconductor laser of from 700 to 1,300 nm, or the like.

An appropriate value of the laser exposure amount varies depending on a laser light source or a type of plotter used, but preferably from 0.5 to 100 µJ/cm$^2$ in the semiconductor laser of blue-violet zone of from 390 to 430 nm, from 5 to 500 µJ/cm$^2$ in the FD-YAG laser of in the vicinity of 532 nm and the argon ion laser of in the vicinity of 488 nm, and from 0.5 to 200 mJ/cm$^2$ in the semiconductor laser of from 700 to 1,300 nm.

If necessary, after laser exposure, the exposed printing plate may be subjected to heat treatment at a temperature in the range of from 40 to 300° C., but may be developed with a developer without heat treatment.

In the treating method of the present invention, after subjecting the photosensitive lithographic printing plate to image-exposure by laser light, the protective layer may be washed with water before development to remove all or most part of the protective layer. The method of washing with water is not particularly limited, but examples include a method of dipping into water to dissolve, a method of dissolving by applying shower-like water thereto, and a method of removing with a brush in the state of dipped in water or sprayed with water. The washing with water is carried out generally at a temperature of from 4 to 70° C., preferably from 10 to 50° C., more preferably from 15 to 30° C., and washing time varies depending on a method for washing, but is usually from 1 second to 5 minutes. Washing water may optionally contain a surfactant, a water-miscible organic solvent or the like.

The developer used in the present invention is an aqueous solution containing an alkali metal silicate. Examples of the alkali metal silicate include potassium silicate, sodium silicate, lithium silicate, potassium metasilicate, sodium metasilicate and the like, and its concentration is from 0.1 to 10 wt %. Also, in addition to the alkali metal silicate, an inorganic alkali agent such as potassium hydroxide, sodium hydroxide, lithium hydroxide, sodium tertiary phosphate, sodium secondary phosphate, sodium carbonate, potassium carbonate, sodium bicarbonate or the like, and an organic amine compound such as trimethylamine, diethylamine, isopropylamine, n-butylamine, monoethanolamine, diethanolamine, triethanolamine or the like may be used as an alkali agent in combination therewith.

The developer of the present invention preferably further contains a surfactant to improve an image quality and to reduce a developing time. Examples of the surfactant used in the developer of the present invention include a nonionic surfactant such as polyoxyethylene alkyl ethers including polyoxyethylene lauryl ether, polyoxyethylene cetyl ether, polyoxyethylene stearyl ether or the like, polyoxyethylene alkylallyl ethers including polyoxyethylene octylphenyl ether, polyoxyethylene nonylphenyl ether or the like, polyoxyethylene alkyl esters including polyoxyethylene stearate or the like, sorbitan alkyl esters including sorbitan monolaurate, sorbitan monostearate, sorbitan distearate, sorbitan monooleate, sorbitan sesquioleate, sorbitan trioleate or the like, monoglyceride alkyl esters including glycerol monostearate, glycerol monooleate or the like, and the like; an anionic surfactant such as alkylbenzene sulfonates including sodium dodecylbenzene sulfonate or the like, alkylnaphthalene sulfonates including sodium butylnaphthalene sulfonate, sodium pentylnaphthalene sulfonate, sodium hexylnaphthalene sulfonate, sodium octylnaphthalene sulfonate or the like, alkylsulfates including sodium laurylsulfate or the like, alkylsulfonates including sodium dodecylsulfonate or the like, sulfosuccinic acid ester salts including sodium dilaurylsulfosuccinate, and the like; and an amphoteric surfactant such as alkylbetaines including laurylbetaine, stearylbetaine or the like, amino acids or the like. Particularly preferable examples include an anionic surfactant such as alkylnaphthalene sulfonates.

These surfactants may be used alone or in combination thereof. Also, the content of these surfactants in the developer is preferably from 0.1 to 5 wt % in terms of effective components.

The developer used in the present invention includes not only a virgin developer used at the initial stage of development but also a refreshed developer (i.e. "running developer") retaining an activity obtained by supplying a supplying developer to a used developer, the developing performance of which was lowered by treating a photosensitive lithographic printing plate.

Also, the developer used in the present invention includes any developer practically capable of treating a photosensitive lithographic printing plate.

The developer used in the present invention may further contain the following additional components in addition to the above components. Examples of the additional components include an organic carboxylic acid such as benzoic acid, phthalic acid, p-ethylbenzoic acid, p-n-propylbenzoic acid, p-isopropylbenzoic acid, p-n-butylbenzoic acid, p-t-butylbenzoic acid, p-t-butylbenzoic acid, p-2-hydroxyethylbenzoic acid, decanoic acid, salicylic acid, 3-hydroxy-2-naphthoic acid or the like; an organic solvent such as isopropyl alcohol, benzyl alcohol, ethyl cellosolve, butyl cellosolve, phenyl cellosolve, propylene glycol, diacetone alcohol or the like; and a chelating agent, a reducing agent, a dye, a pigment, a water softener, an antiseptic agent, and the like. The developer preferably has a pH value of from 9 to 14, more preferably from 9 to 12.

The development can be carried out by a well known developing method such as dipping development, spraying development, brush development, ultrasonic wave development or the like, preferably at a temperature of from 10 to 60° C., more preferably from 15 to 45° C., for 5 seconds to 10 minutes. An oxygen-shielding layer may be previously removed with water, or may be removed at the time of development.

The treating method of the present invention is characterized by carrying out post-exposure (whole surface exposure) to an image obtained by this development, and examples of a light source used for the post-exposure are not specially limited but include a carbon arc, a high pressure mercury lamp, a xenon lamp, a metal halide lamp, a fluorescent lamp, a tungsten lamp, a halogen lamp or the like, which has a wavelength of from 200 to 1,100 nm. Light emitted from these light sources may be used by controlling wavelength through a filter or the like. Among them, it is preferable to use a mercury lamp in view of printing resistance of a printing plate.

As a mercury lamp, any of an ultra high pressure mercury lamp, a high pressure mercury lamp and a low pressure mercury lamp can be used, and as a lighting system, any of a stationary lighting system, a flash lighting system and an instant lighting system may be used.

A light amount of post-exposure is not specially limited, but a higher effect can be expected if the light amount is larger, and the light amount is usually in the range of from 10 to 10,000 $mJ/cm^2$, preferably in the range of from 10 to 1,000 $mJ/cm^2$ in view of rationalization of a step of preparing a printing plate. As a method for exposure, the exposure may be carried out by stopping an image or by continuously moving an image.

In the treating method of the second feature of the present invention, it is necessary for carrying out post-light exposure after the development to make a light intensity at least 20 $mW/cm^2$ on the surface to be exposed (an image-forming surface). Particularly, the light intensity is preferably at least 30 $mW/cm^2$, more preferably at least 50 $mW/cm^2$, most preferably at least 70 $mW/cm^2$. If the light intensity is lower than the above-mentioned range, it is difficult to obtain a sufficient image strength. It is better if the light intensity is higher, and its upper limit is not specially limited, but if it is too excessively high, an image strength-improving effect is saturated and it is not favorable from an economical viewpoint. Thus, the upper limit of the light intensity is usually 700 $mW/cm^2$, preferably 500 $mW/cm^2$, more preferably 300 $mW/cm^2$.

As a light source for post-light exposure, the same light sources as mentioned above can be used. Also, as a method for light exposure, light exposure may be carried out by stopping an image or by continuously moving an image, and its light exposure amount is preferably in the range of from 10 to 10,000 $mJ/cm^2$, more preferably from 50 to 8,000 $mJ/cm^2$.

In these light exposure methods, in order to make a light intensity on the surface to be exposed at least 20 $mW/cm^2$, a light exposure method by raising an output (W) of a light source which includes a method of making an output of a light source used larger or making an output per unit length larger in the case of a bar-like light source or a light exposure method by making an image-forming surface closer to a light source, may be employed. As a light source for achieving such a light intensity, the above-mentioned light sources for post-light exposure may be used, and when a mercury lamp is used among them, a satisfactory image strength can be obtained without specially employing a step for heating a printing plate. Thus, a mercury lamp is particularly preferable. The shape of a mercury lamp is not limited, but preferable examples include a bar-like type mercury lamp (H03-L31, H04-L41 or the like manufactured by EYEGRAPHICS CO.), a self ballast mercury lamp (BHF200/220 V 300 W manufactured by EYEGRAPHICS CO.), a sphere-like type mercury lamp used for carrying out post-light exposure of a usual photosensitive lithographic printing plate, and the like.

In the second feature of the present invention, a temperature of a surface to be exposed at the post-exposure is preferably from 40 to 300° C., more preferably from 50 to 200° C. In order to make the temperature of the surface to be treated in the above-mentioned range, a method for raising an output of a light source for light exposure, a method for light exposure by placing a light source closer to the surface to be exposed, or a method for heating by a hot plate, a dryer or a ceramic heater, may be employed.

EXAMPLES

Hereinafter, the present invention is more concretely explained by referring to the following Examples, but should not be limited thereto.

Preparation of High Molecular Binder-1

200 Parts by weight of a copolymer of methyl methacrylate/isobutyl methacrylate/isobutyl acrylate/methacrylic acid=35/20/10/35 mol % (charge ratio) having a weight average molecular weight (Mw) of 70,000 (hereinafter referred to as "base resin-1"), 75 parts by weight of an unsaturated compound having the following cycloaliphatic epoxy group, 2.5 parts by weight of p-methoxyphenol, 8 parts by weight of tetrabutylammonium chloride, and 800 parts by weight of propylene glycol monomethyl ether acetate were placed in a reactor, and were reacted at 110° C. for 24 hours in air with stirring to obtain a solution of high molecular binder-1 (acid value=60, an unsaturated group was reacted with 60% of the total methacrylic acid component of base resin-1).

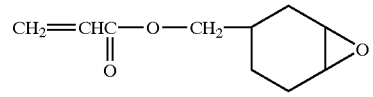

Preparation of High Molecular Binder-2

855 Parts by weight of a copolymer of α-methylstyrene/acrylic acid (tradename "SCX-690" manufactured by Johnson Co., acid value=240, Mw=15,000), 490 parts by weight of an unsaturated compound containing the following cycloaliphatic epoxy group, 1.3 parts by weight of p-methoxyphenol, 4.3 parts by weight of tetraethylammonium chloride, and 1,800 parts by weight of propylene glycol monomethyl ether acetate were placed in a reactor, and were reacted at 120° C. for 15 hours in air with stirring to obtain a solution of high molecular binder-2 (acid value= about 170, an unsaturated group was reacted with about 50% of the total methacrylic acid component of SCX-690).

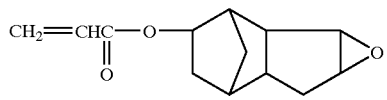

Support-1

An aluminum plate was degreased with 3% sodium hydroxide, and was then subjected to etching in a nitric acid bath of 18.0 g/l at 25° C. and a current density of 80 A/dm² for 15 seconds, and was then subjected to desmut treatment with a 1% sodium hydroxide aqueous solution at 50° C. for 5 seconds, and was then neutralized with a 10% nitric acid aqueous solution at 25° C. for 5 seconds. After washing with water, the aluminum plate thus obtained was anodized in a 30% sulfuric acid bath under conditions of 30° C. and 10 A/dm² for 16 seconds, and was washed with water and dried to obtain support-1 having a Ra value of 0.55 μm.

Support-2

An aluminum plate was degreased with 3% sodium hydroxide, and was then subjected to etching in a hydrochloric acid bath of 11.5 g/l at 25° C. and a current density of 80 A/dm² for 11 seconds, and was then subjected to desmut treatment with a 1% sodium hydroxide aqueous solution at 50° C. for 5 seconds, and was then neutralized with a 10% nitric acid aqueous solution at 25° C. for 5 seconds. After washing with water, the aluminum plate was anodized in a 30% sulfuric acid bath under conditions of 30° C. and 10 A/dm² for 16 seconds, and was washed with water and dried to obtain support-2 having a Ra value of 0.63 μm.

Support-3 (Comparative Support)

Support-3 having a Ra value of 0.3 μm was obtained in the same manner as in the preparation of support-1, except that the etching conditions in the nitric acid bath were changed to an electric current density of 40 A/dm² and an etching time of 5 seconds.

Preparation of Photosensitive Lithographic Printing Plates 1 to 9

A coating solution of the following photopolymerizable composition was coated on each of the above supports-1, 2 and 3 by a bar coater, and was dried. Further, a polyvinyl alcohol aqueous solution was coated thereon and was dried to form a protective layer, thus preparing photosensitive lithographic printing plates 1 to 9. A dry film thickness of each of the photosensitive lithographic printing plates thus prepared is shown in the following Table 1.

| Coating solution of photopolymerizable composition | |
|---|---|
| Ethylenic monomer shown in Table 1 | Total 55 parts by weight |
| High molecular binder shown in Table 1 | 45 parts by weight |
| Compound of the following structure (A) | 2.0 parts by weight |
| Titanocene compound of the following structure (B) | 10 parts by weight |
| 2-Mercaptobenzothiazole | 5.0 parts by weight |
| Ethyl N,N-dimethylbenzoate ester | 10 parts by weight |
| Copper phthalocyanine pigment | 3.0 parts by weight |
| Cyclohexanone | 1090 parts by weight |

Coating solution of photopolymerizable composition

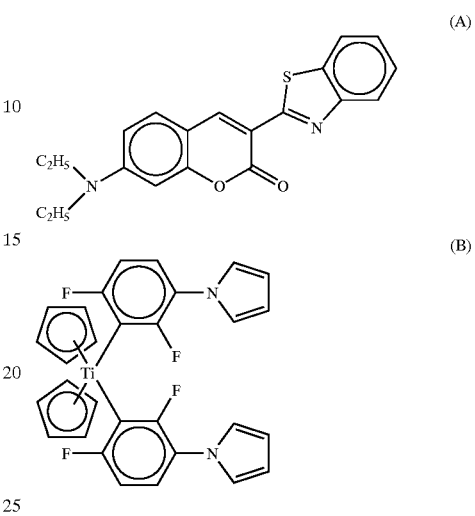

TABLE 1

| | | Photosensitive lithographic printing plate | | | | | | | | |
|---|---|---|---|---|---|---|---|---|---|---|
| | | 1 | 2 | 3 | 4 | 5 | 6 | 7 | 8 | 9 |
| Ethylenic monomer (part by weight) | 1 | 5 | 5 | 5 | 5 | 5 | 5 | 10 | 10 | 10 |
| | 2 | 25 | 25 | 25 | 25 | 25 | 25 | 23 | 23 | 23 |
| | 3 | 25 | 25 | 25 | 25 | 25 | 25 | 23 | 23 | 23 |
| High molecular binder (part by weight) | 1 | 40 | 40 | 40 | 40 | 40 | 40 | 34 | 34 | 34 |
| | 2 | 5 | 5 | 5 | 5 | 5 | 5 | 10 | 10 | 10 |
| Support | | 1 | 1 | 1 | 2 | 3 | 3 | 1 | 1 | 1 |
| Thickness of photosensitive layer (g/m²) | | 2 | 1 | 2 | 2 | 2 | 1 | 2 | 5 | 2 |
| Thickness of protective layer (g/m²) | | 3 | 3 | 8 | 3 | 3 | 3 | 4 | 4 | 1 |

Ethylenic monomers shown in the above Table 1 are illustrated below.

1: PM-2 manufactured by Nihon Kayaku K.K.

1:1 (mol ratio) mixture of

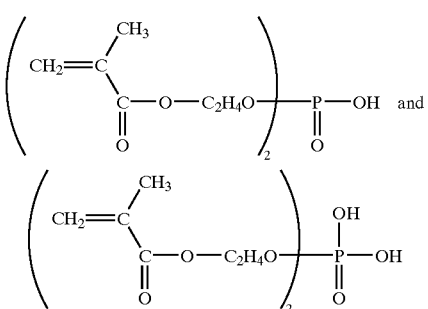

2: UA-306H manufactured by Shin Nakamura Kagaku K.K.

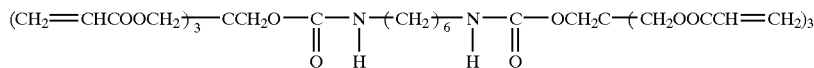

3: DPHA manufactured by Nihon Kayaku K.K.

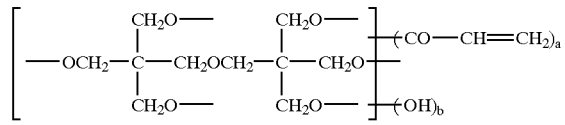

a=6, b=0 and a=5, b=1

Examples 1 to 3 and Comparative Examples 1 to 12

The above prepared photosensitive lithographic printing plates 1 to 9 were subjected to internal drum system scanning light exposure with argon laser (light amount: 130 $\mu J/cm^2$, wavelength: 488 nm).

The photosensitive lithographic printing plate 1 to 9 thus subjected to light exposure treatment as mentioned above were developed with the developers shown in the following Table 2 by using an automatic developing machine HL-860X (manufactured by Mitsubishi Chemical Corporation). A developer temperature was 30° C. and a conveying speed was 60 cm/min.

Thereafter, a part of the above obtained printing plates were subjected to post-light exposure treatment with a mercury lamp (150 $mJ/cm^2$) in accordance with the conditions as shown in the following Table 2.

The printing plates thus obtained were subjected to printing resistance test by a printing machine (Roland RP-1). The printing resistance was evaluated by reproducibility of 2% small dots of an image part after printing 100,000 sheets (evaluation mark ○ means that at least 80% was reproduced, and evaluation mark X means that the reproducibility was less than 80%).

Further, the above prepared photosensitive lithographic printing plates 1 to 9 were stored for 6 months, and were subjected to printing resistance test. In this test, a staining property was evaluated by a number of printing times required to reach such a normal state as not to stain a printing plate after compulsorily damping the whole surface of a printing plate with water and recharging a damping water (evaluation mark ○ means that the number of printing times required to reach the normal state is less than 20 sheets, and evaluation mark X means that the number of printing times required to reach the normal state is at least 20 sheets).

The developers used were as follows:

| Developer-1 (pH = 10.8) | |
|---|---|
| Potassium silicate (JIS A potassium silicate) | 3 wt % |
| Perex NBL (manufactured by Kao K.K.) | 5 wt % |
| (Sodium alkylnaphthalene sulfonate: content = 35%) | |
| Water | 92 wt % |
| Developer-2 (pH = 11.0) | |
| Sodium carbonate | 0.5 wt % |
| Perex NBL (manufactured by Kao K.K.) | 5 wt % |
| (Sodium alkylnaphthalene sulfonate: content = 35%) | |
| Water | 94.2 wt % |

TABLE 2

| | Lithographic printing plate (remark) | Developer | Post-exposure | Printing resistance | Printing resistance after 6 months | Stain property (remark) |
|---|---|---|---|---|---|---|
| Example 1 | 1 | 1 | done | ○ | ○ | ○ |
| Comparative Example 1 | 1 | 1 | nil | X | X | ○ |
| Comparative Example 2 | 1 | 2 (Si absent) | done | ○ | ○ | X |
| Comparative Example 3 | 2 (Thin film photosensitive layer) | 1 | done | ○ | X | X (Developing property became poor.) |
| Comparative Example 4 | 2 (Thin film photosensitive layer) | 1 | nil | X | X | X (Developing property became poor.) |
| Comparative Example 5 | 3 (Thick film protective layer) | 1 | done | ○ | X | X (Developing property became poor.) |
| Example 2 | 4 | 1 | done | ○ | ○ | ○ |
| Comparative Example 6 | 4 | 1 | nil | X | X | ○ |
| Comparative Example 7 | 4 | 2 (Si absent) | done | ○ | ○ | X |
| Comparative Example 8 | 5 (Ra small) | 1 | done | X | X | ○ |
| Comparative Example 9 | 6 (Ra small) | 1 | done | X | X | ○ |
| Example 3 | 7 | 1 | done | ○ | ○ | ○ |

TABLE 2-continued

| | Lithographic printing plate (remark) | Developer | Post-exposure | Printing resistance | Printing resistance after 6 months | Stain property (remark) |
|---|---|---|---|---|---|---|
| Comparative Example 10 | 7 | 1 | nil | X | X | ○ |
| Comparative Example 11 | 8 (Thick film photosensitive layer) | 1 | done | X | X | ○ |
| Comparative Example 12 | 9 (Thin film photosensitive layer) | 1 | done | X | X | ○ |

As evident from Comparative Examples 1, 6 and 10, printing resistance is poor when post-light exposure is not carried out even if the photosensitive lithographic printing plates of the present invention are employed.

As evident from Comparative Examples 2 and 7, stain property is poor when the developer used does not contain an alkali metal silicate.

As evident from Comparative Examples 3, 4 and 11, when a photosensitive layer film thickness is too thin, stain property and printing resistance after storing are poor, and when a photosensitive layer is too thick, printing resistance is poor.

As evident from Comparative Examples 5 and 12, when a protective layer film thickness is too thick, developing property and printing resistance after storing are poor, and when a protective layer is too thin, printing resistance is poor.

As evident from Comparative Examples 8 and 9, when a roughness value Ra is too small, printing resistance is poor.

On the other hand, as proved by Examples 1 to 3, the present invention provides satisfactory results in respect of all of printing resistance and stain property.

Examples 4 to 7 and Comparative Examples 13 to 15

A coating solution of a photopolymerizable composition comprising an ethylenic unsaturated compound of the following component (A), a photosensitizer, a polymerization accelerator and a radical generator as a polymerization initiator of the following component (B), a high molecular binder of the following component (C), and other components and solvents was coated on the surface of the following aluminum plate support by a bar coater so as to obtain a dry film thickness of 2.0 g/m² and was dried to form a photosensitive layer of the photopolymerizable composition, and a mixture aqueous solution of polyvinyl alcohol and polyvinylpyrrolidone (polyvinyl alcohol:polyvinylpyrrolidone=70 wt %:30 wt %) was further coated thereon by a bar coater so as to form a dry film thickness of 3 g/m², and was dried to form an oxygen-shielding layer, thus preparing a photosensitive lithographic printing plate.

Support-4

The aluminum plate (thickness: 0.24 mm) was degreased with a 3 wt % sodium hydroxide aqueous solution, and was washed with water, and was neutralized by dipping in a 30 wt % sulfuric acid aqueous solution, and was further washed with water. The aluminum plate thus treated was subjected to surface-roughening treatment by hydrolyzing in a 2 wt % nitric acid aqueous solution as an electrolyte at an electric current density of 80 A/dm² at 25° C. for 11 seconds, and was washed with water, and was subjected to desmut treatment by dipping in a 1 wt % sodium hydroxide aqueous solution at 50° C. for 3 seconds, and was then washed with water, and was neutralized by dipping in a 30 wt % sulfuric acid aqueous solution, and was further washed with water.

The aluminum plate thus treated was further subjected to anodizing treatment in a 18 wt % sulfuric acid aqueous solution as an electrolyte at an electric current density of 10 A/dm² at 30° C. to form an anodized film of 23 mg/dm²; and was washed with water. Thereafter, the aluminum plate thus obtained was dipped in a 0.1 wt % ammonium acetate aqueous solution (pH=9.0) at 85% for 20 seconds, and was treated with a hot water of 90° C. for 10 seconds, and was dried to obtain the aluminum plate support having a roughness value Ra=0.60 μm.

(A) Ethylenic Unsaturated Compound

① Mixture of methacryloyloxyethyl phosphate and bis(methacryloyloxyethyl)phosphate (PM-2 manufactured by Nihon Kayaku K.K. used in Example 1): 11 parts by weight ② Hexamethylenebis[tris(acryloyloxymethyl)-ethylurethane] (UA-306H manufactured by Shin Nakamura Kagaku K.K. used in Example 1): 22 parts by weight ③ 2,2-bis (4-acryloyloxydiethyleneoxyphenyl) propane of the following formula C: 22 parts by weight

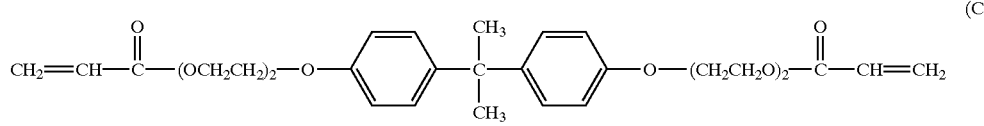

(C)

(B) Photopolymerization Initiator (B-1) Radical Generator

① Dicyclopentadienyltitaniumbis[2,6-difluoro-3-(1-pyrrolyl)phenyl] (compound of the above formula (B)): 5 parts by weight (B-2) Photosensitizer ② Compound of the following formula D: 0.5 part by weight ③ Compound of the following formula E: 0.5 part by weight

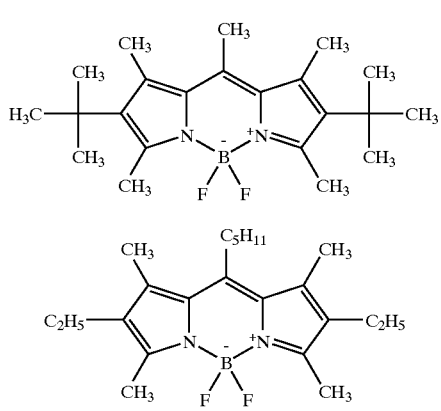

(B-3) Polymerization Accelerator
④ 2-Mercaptobenzothiazole: 5 parts by weight
⑤ N-phenylglycinebenzyl ester: 5 parts by weight
(C) High Molecular Binder-3
① Reaction product obtained by reacting 3,4-epoxycyclohexylmethyl acrylate with methyl methacrylate (80 mol %)/methacrylic acid (20 mol %) copolymer (weight average molecular weight: 50,000) (acid value= 53, 50 mol % of a carboxyl group of methacrylic acid component was reacted): 45 parts by weight
Other Components
① Pigment (P.B. 15:6): 4 parts by weight
② Dispersing agent ("Disperbyk161" manufactured by Big Chemi Co.): 2 parts by weight
③ Surfactant ("Emulgen104P" manufactured by Kao K.K.): 2 parts by weight
④ Surfactant ("S-381" manufactured by Asahi Glass Company, Limited): 0.3 part by weight
Solvent
① Propylene glycol monomethyl ether acetate: 600 parts by weight
② Cyclohexanone: 545 parts by weight Each of the above obtained photosensitive lithographic printing plates was subjected to 100% image-exposure by using a FD-YAG laser exposing machine ("Platejet" manufactured by Cymbolic Science International Co.) under conditions of 2000 dpi, 6.8 mW (exposure light amount: 120 $\mu J/cm^2$), and was then developed by dipping in a developer comprising 3 wt % of potassium silicate, 5 wt % of sodium alkylnaphthalene sulfonate (concentration: 35 wt %, "Perex NBL" manufactured by Kao K.K.) and 92 wt % of water at 25° C. for 30 seconds and by stroking with a sponge one time.

Further, the lithographic printing plate thus treated was subjected to post-exposure treatment under such conditions of post-exposure light source, light intensity on image-forming surface and temperature on image-forming surface as shown in Table 1, and the lithographic printing plate thus treated was subjected to abrasion test in the following manner to evaluate an image strength, and results are shown in the following Table 3.

A mercury lamp used was H04-L41 manufactured by EYEGRAPHICS Co. (using a gold mirror and a heat ray-cutting filter). An exposure light amount and an exposure light intensity were measured by using UVPZ-1 manufactured by EYEGRAPHICS Co.

A metal halide lamp used was GL-30201BF manufactured by Ushio Denki K.K. An exposure light amount and an exposure light intensity were measured by UV430API (manufactured by Oak Seisakusho).

Abrasion Test
Abrasion resistance of an image film was measured by reciprocating a woolen cloth for printing in direct contact with an image-forming surface under a load of 150 g/cm² by using an abrasion test machine ("FR-2" manufactured by Suga Shikenki K.K.), and the test results were evaluated by the following evaluation marks.

○: No change is recognized on a film.

Δ: Abarasion is recognized on a film.

X: A film is substantially separated.

TABLE 3

| | Metal halide lamp | | High pressure mercury lamp | | | |
|---|---|---|---|---|---|---|
| | intensity (mW/cm²) | Total exposure amount (mJ/cm²) | Light intensity (mW/cm²) | Total exposure amount (mJ/cm²) | Hot plate heating | Image strength |
| Ex. 4 | 20 | 2500 | — | — | Done (at 130° C.) | ○ |
| Ex. 5 | 80 | 2500 | — | — | Done (at 130° C.) | ○ |
| Ex. 6 | — | — | 100 | 2500 | nil | ○ |
| Ex. 7 | — | — | 100 | 300 | nil | ○ |
| Comp. Ex. 13 | 8 | 2500 | — | — | Done (at 130° C.) | X |
| Comp. Ex. 14 | 13 | 2500 | — | — | Done (at 130° C.) | X |
| Comp. Ex. 15 | — | — | 13 | 300 | nil | X |

As evident from Examples 4 to 7 and Comparative Examples 13 to 15, when a light intensity is high, an image strength is excellent even if the total exposure light amount of post-exposure is the same.

The printing plates obtained in Examples 4 to 7 exhibit a high printing resistance at the time of printing, and particularly Examples 6 and 7 exhibit a remarkably improved printing resistance.

EFFECT OF THE INVENTION

The photosensitive lithographic printing plate of the first feature of the method of the present invention provides a satisfactory printing resistance before and after storing, and provides a satisfactory stable printing performance without staining.

According to the second feature of the method of the present invention, an image obtained by scanning exposure with laser light provides a satisfactory image strength, and a satisfactory printing resistance at the time of printing. Also, according to the second feature of the method of the present invention, an exposure light amount required by laser exposure can be reduced since a satisfactory image strength can be provided.

What is claimed is:

1. A method for treating a photosensitive lithographic printing plate, which comprises exposing the photosensitive lithographic printing late to laser light, developing and then carrying out post-exposure treatment at a light intensity of from 20 to 700 mW/cm² on a surface to be exposed at the time of the post-exposure treatment, said photosensitive lithographic printing plate being prepared by forming a photosensitive layer comprising a photopolymerizable composition containing ethylenic compound, a photopolymerization initiator and a high molecular binder on the surface of a support.

2. The method for treating a photosensitive lithographic printing plate according to claim 1, wherein the light intensity on the surface to be exposed at the time of post-exposure is at least 50 mW/cm$^2$.

3. The method for treating a photosensitive lithographic printing plate according to claim 1, wherein the temperature on the surface to be exposed at the time of post-exposure is from 40 to 300° C.

4. The method for treating a photosensitive lithographic printing plate according to claim 1, wherein a mercury lamp is used as a light source for post-exposure.

5. The method for treating a photosensitive lithographic printing plate according to claim 1, wherein the photopolymerization initiator contains titanocenes as a radical-generating agent.

6. The method for treating a photosensitive lithographic printing plate according to claim 1, wherein the photopolymerization initiator contains a photosensitizes having an absorption in a visible light zone.

7. The method for treating a photosensitive lithographic printing plate according to claim 1, wherein the high molecular binder contains a polymer having an ethylenic unsaturated bond on a side chain.

8. The method for treating a photosensitive lithographic printing plate according to claim 1, wherein the photosensitive lithographic printing plate further has a protective layer formed on the photosensitive layer comprising the photopolymerizable composition.

9. The method for treating a photosensitive lithographic printing plate according to claim 8, wherein the support has a centerline average height (Ra) of at least 0.35 μm, and the photosensitive layer has a film thickness of from 1.2 to 4 g/m$^2$, and the protective layer has a film thickness of from 2 to 8 g/m$^2$.

10. The method for treating a photosensitive lithographic printing plate according to claim 1, wherein the developing treatment is carried out by using a developer containing an alkali metal silicate.

11. The method for treating a photosensitive lithographic printing plate according to claim 1, wherein the developing treatment is carried out by using a developer having a pH value of at most 12.

12. The method for treating a photosensitive lithographic printing plate according to claim 1, wherein said light intensity is from 20 to 500 mW/cm$^2$.

13. The method for treating a photosensitive lithographic printing plate according to claim 12, wherein said light intensity is from 20 to 300 mW/cm$^2$.

* * * * *